(12) United States Patent
Hine et al.

(10) Patent No.: US 8,552,307 B2
(45) Date of Patent: Oct. 8, 2013

(54) MOUNTING STRUCTURE (75) Inventors: Kiyohiro Hine, Osaka (JP); Shigeaki Sakatani, Osaka (JP); Akio Furusawa, Osaka (JP)

(73) Assignee: Panasonic Corporation, Osaka (JP)

( * ) Notice: Subject to any disclaimer, the term of this patent is extended or adjusted under 35 U.S.C. 154(b) by 218 days.

(21) Appl. No.: 13/110,136

(22) Filed: May 18, 2011

(65) Prior Publication Data

US 2011/0284278 A1    Nov. 24, 2011

(30) Foreign Application Priority Data

May 20, 2010   (JP) ................................. 2010-116353

(51) Int. Cl.
*H05K 1/18* (2006.01)
(52) U.S. Cl.
USPC .......................................................... 174/260
(58) Field of Classification Search
USPC ................................. 174/260, 265
See application file for complete search history.

(56) References Cited

U.S. PATENT DOCUMENTS 7,960,816 B2 *   6/2011   Chow et al. ................... 257/672
2002/0179322 A1  12/2002  Sakai et al.

FOREIGN PATENT DOCUMENTS

JP    2002-359461 A    12/2002

* cited by examiner

*Primary Examiner* — Chau Nguyen
(74) *Attorney, Agent, or Firm* — RatnerPrestia (57) ABSTRACT

A mounting structure includes an insulating substrate having a substrate electrode on which at least one electrode notch is provided and a resist, an electronic component having an electronic component electrode to be electrically connected to the substrate electrode, and solder paste printed on a surface of the substrate electrode. The substrate electrode has a following relation, $0 < h\ (\mu m) \leq x\ (\mu m) + 75\ (\mu m)$, where $h\ (\mu m)$ is a width and $x\ (\mu m)$ is a depth of the electrode notch, and the electrode notch is formed from an end of an area, which is located under of the electronic component electrode, of the substrate electrode, or from inside of the area to a peripheral side of the substrate electrode, and the electrode notch does not reach a peripheral side, which is located under the electronic component, of the substrate electrode.

7 Claims, 13 Drawing Sheets

MOUNTING STRUCTURE

BACKGROUND OF THE INVENTION

1. Field of the Invention

The present invention relates to mounting structures fabricated by surface mount technology (hereinafter, will be abbreviated to SMT).

2. Related Art of the Invention

A mounting structure of the related art is fabricated in SMT steps as follows: first, solder paste composed of solder of spherical solid metals and liquid flux is applied to substrate electrodes on a surface of an insulating substrate by mask printing; an electronic component, e.g., a chip capacitor or an IC with electronic component electrodes is mounted on the solder paste; the solder is melted by heating to at least the melting point of the solder; and finally, the solder is solidified by cooling to electrically connect the substrate electrodes and the electronic component electrodes.

Unfortunately, solder balls may occur in the process of fabricating the mounting structure according to SMT.

Figure 12:
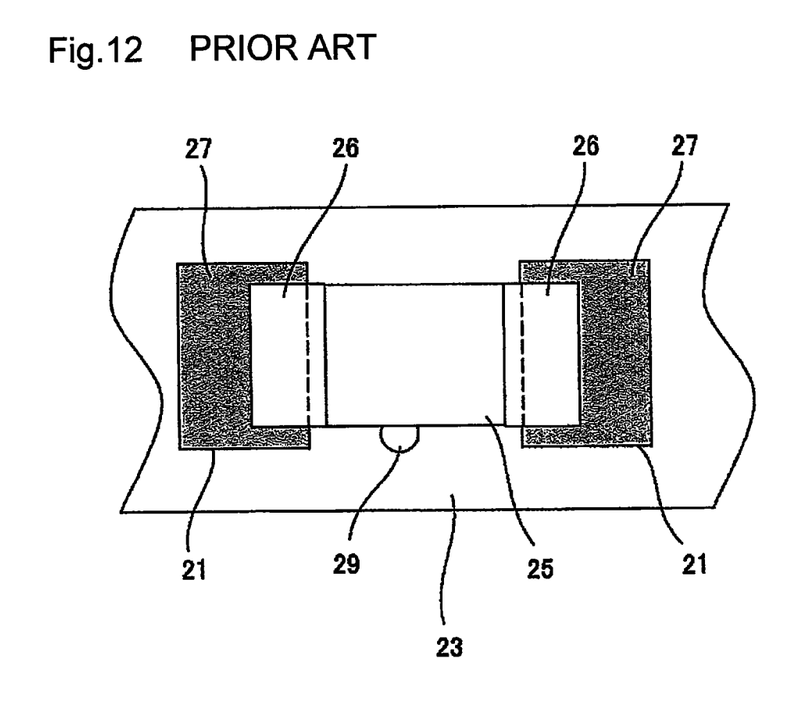
FIG. 12 is an enlarged view showing the principle part of a mounting structure with a solder ball according to the related art.

FIG. 12 is an enlarged view of a principle part of the mounting structure having a solder ball. In FIG. 12, reference numeral 21 denotes substrate electrodes, reference numeral 23 denotes a resist, reference numeral 25 denotes an electronic component, reference numeral 26 denotes electronic component electrodes, reference numeral 27 denotes solder paste composed of flux and solder, and reference numeral 29 denotes a solder ball.

As shown in FIG. 12, the solder ball 29 is spherical solder and appears beside the electronic component 25 on the resist 23. The solder ball 29 occurs in the case where the solder paste 27 printed on the substrate electrodes 21 is pressed out onto the resist 23 under the electronic component 25 when the electronic component 25 is mounted, or solder particles flow under the electronic component 25 because flux containing the solder particles flows due to heat (hereinafter, will be referred to as a dipping phenomenon of flux) during heating.

The solder ball 29 is not metallically joined to the substrate electrodes 21 and the electronic component electrodes 26 and thus may fall off the electronic component 25 in the event of a dynamic load. The solder ball 29 having fallen off the electronic component 25 may move between the two substrate electrodes electrically unconnected to each other and cause a short circuit, resulting in failures such as malfunctions and breakdowns of electronic equipment. Particularly, in the case of an insulating substrate for vehicles, a dynamic load of vibrations during operations is large and the solder ball 29 is likely to occur. Thus it is important to suppress the occurrence of the solder ball 29 in view of safety and operation reliability of equipment.

In a mounting structure designed to suppress the occurrence of solder balls according to the related art, a flow of solder paste under an electronic component is suppressed when the electronic component is mounted (e.g., see Japanese Patent Laid-Open No. 2002-359461).

Figure 13A:
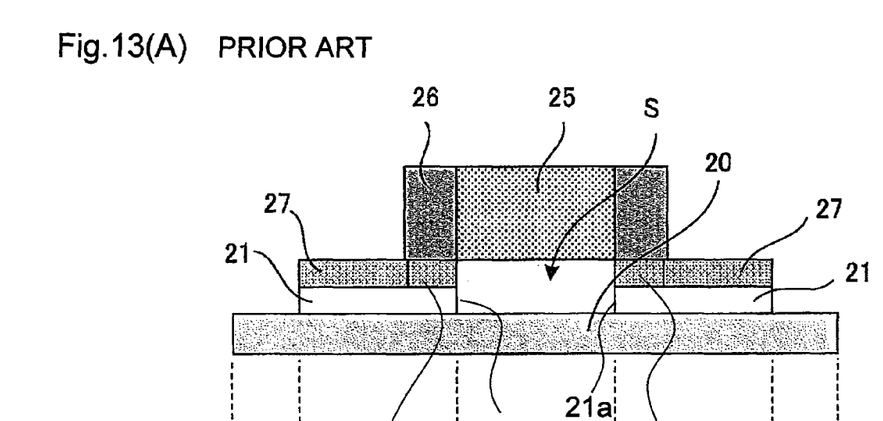
FIG. 13(A) is a side view showing the structure of a mounting structure according to the related art.
Figure 13B:
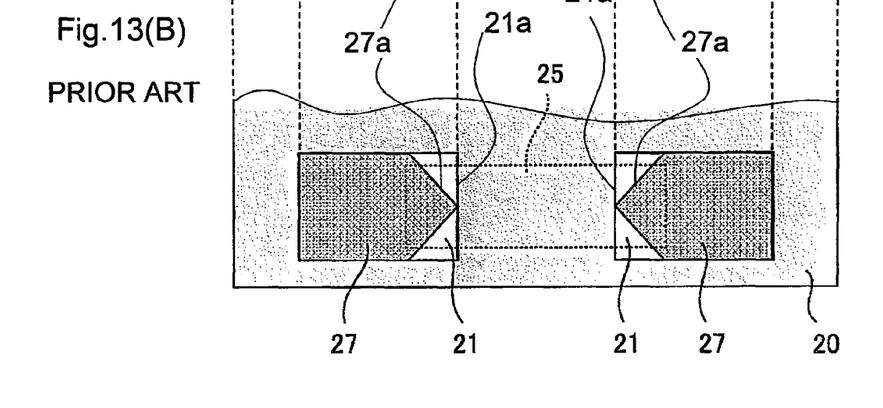
FIG. 13(B) is a top view of FIG. 13(A).

FIG. 13(A) is a side view showing the structure of the mounting structure described in Japanese Patent Laid-Open No. 2002-359461. FIG. 13(B) is a top view of FIG. 13(A).

The mounting structure of FIGS. 13(A) and 13(B) includes an insulating substrate 20 having an electronic component 25, electronic component electrodes 26, solder paste 27, and substrate electrodes 21.

In FIGS. 13(A) and 13(B), under the electronic component electrodes 26, the opening of a metal mask is formed such that an edge 27a of the solder paste 27, that is, an edge of the opening of the metal mask (not shown) is located inside an edge 21a of the substrate electrode 21. Thus the occurrence of solder balls is suppressed by reducing the amount of the solder paste 27 pressed out of the substrate electrodes 21 when the electronic component 25 is mounted, without considerably reducing the total amount of the solder paste 27.

SUMMARY OF THE INVENTION

In the structure of FIGS. 13(A) and 13(B) according to the related art, however, the solder paste 27 printed on the substrate electrodes 21 is less likely to be pressed out under the electronic component 25 when the electronic component 25 is mounted, while a dipping phenomenon of flux during heating cannot be suppressed in the SMT steps. Thus a solder flow under the electronic component 25 cannot be reduced.

When flux flows due to a dipping phenomenon of flux, a capillary force is applied to the flux toward the bottom of the electronic component 25 because a space S having a width of about 100 μm is formed between the insulating substrate 20 and the electronic component 25. The flux flow caused by the dipping phenomenon of flux allows the solder on the substrate electrodes 21 to flow under the electronic component 25. The solder is solidified beside the electronic component 25, leading to the generation of a solder ball.

Since the main factor of the occurrence of solder balls is a solder flow caused by a dipping phenomenon of flux, the occurrence of solder balls is insufficiently suppressed in the configuration of the related art.

The present invention has been devised to solve the problem of the related art. An embodiment of the present invention provides a mounting structure which reduces a solder flow caused by a dipping phenomenon of flux and suppresses the occurrence of solder balls.

In order to attain the object, the $1^{st}$ aspect of the present invention is a mounting structure comprising:

an insulating substrate having a substrate electrode on which at least one space is provided and a resist surrounding the substrate electrode;

an electronic component having an electronic component electrode to be electrically connected to the substrate electrode; and solder paste printed on a surface of the substrate electrode, the solder paste being used for soldering the substrate electrode and the electronic component electrode;

wherein the space has a following relation $$0 < h(\mu m) \leq x(\mu m) + 75(\mu m)$$

where h (μm): width of the space x (μm): depth of the space, the width of the space is defined as a dimension in a crosswise direction of the space, the space is formed from an end of an area of the substrate electrode, the area being located under the electronic component electrode, or from inside of the area of the substrate electrode to a peripheral side of the substrate electrode, and the space does not reach a peripheral side of the substrate electrode, the peripheral side being located under the electronic component.

The $2^{nd}$ aspect of the present invention is the mounting structure according to the $1^{st}$ aspect of the present invention, wherein the space has one end closed at the end of the area of the substrate electrode or inside the area of the substrate electrode and the other end opened on the peripheral side of the substrate electrode except for the peripheral side of the substrate electrode, the peripheral side being located under the electronic component.

The 3rd aspect of the present invention is the mounting structure according to the 2nd aspect of the present invention, wherein the electronic component has an external shape like a rectangular solid, the electronic component electrodes are disposed on respective ends of the electronic component in a longitudinal direction of the electronic component, the other end of the space is provided on each of the peripheral sides of a pair of substrate electrodes for the respective electronic component electrodes on the respective ends such that the other ends are located in opposite positions from each other.

The 4th aspect of the present invention is the mounting structure according to the 3rd aspect of the present invention, wherein the space is formed from each of the insides of the areas of the pair of the substrate electrodes to each of the opposite positions of the peripheral sides along the longitudinal direction of the electronic component, the space being located at a center of the electronic component in a crosswise direction of the electronic component.

The 5th aspect of the present invention is the mounting structure according to the 1st aspect of the present invention, wherein a plurality of the spaces are formed on the substrate electrode.

The 6th aspect of the present invention is the mounting structure according to the 1st aspect of the present invention, wherein the depth of the space is equivalent to a thickness of the substrate electrode.

The 7th aspect of the present invention is the mounting structure according to the 1st aspect of the present invention, wherein the resist has a second space opposed to the space.

With this configuration, flux flows in a space due to capillarity, thereby suppressing a flux flow into a space under an electronic component.

The present invention can suppress a flux flow caused by a dipping phenomenon of flux under an electronic component during heating in SMT steps and reduce a solder flow under the electronic component, thereby suppressing the occurrence of solder balls.

| Description of Symbols | |
|---|---|
| 10, 20 | insulating substrate |
| 11, 21 | substrate electrode |
| 12 | electrode notch |
| 12a, 12b | end point |
| 13, 23 | resist |
| 14 | resist notch |
| 15, 25 | electronic component |
| 16, 26 | electronic component electrode |
| 17, 27 | solder paste |
| 18 | mounting structure |
| 29 | solder ball |

PREFERRED EMBODIMENTS OF THE INVENTION

The following will specifically describe embodiments of the present invention in accordance with the accompanying drawings.

(First Embodiment)

Figure 1A:
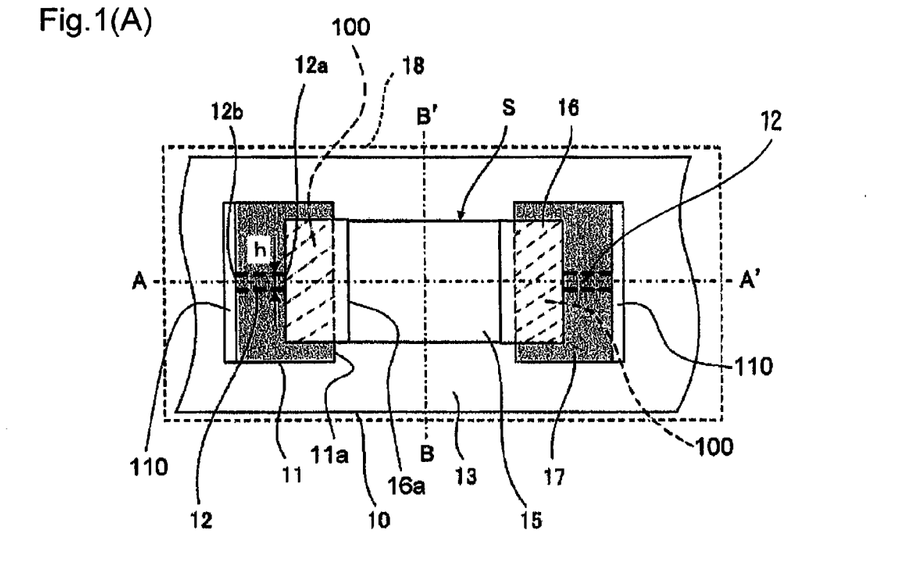
FIG. 1(A) is a top view of an enlarged schematic view showing the principle part of a mounting structure according to a first embodiment of the present invention.
Figure 1B:
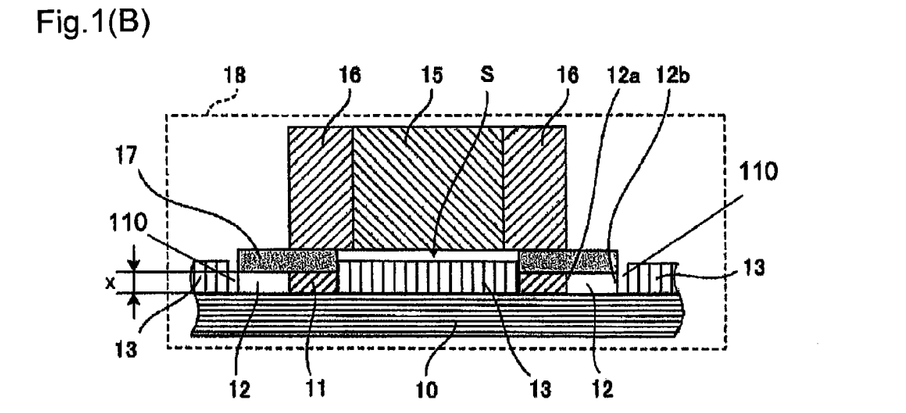
FIG. 1(B) is an A-A' sectional view of FIG. 1(A)

FIGS. 1(A) and 1(B) are enlarged schematic drawings showing the principle part of a mounting structure according to a first embodiment of the present invention. FIG. 1(A) is a top view and FIG. 1(B) is an A-A' sectional view of FIG. 1(A).

A mounting structure 18 of FIGS. 1(A) and 1(B) includes: an insulating substrate 10 on which substrate electrodes 11 and a resist 13 are provided; an electronic component 15 having electronic component electrodes 16; and solder paste 17 used for soldering the substrate electrodes 11 and the electronic component electrodes 16. The substrate electrode 11 has an electrode notch 12. The solder paste 17 is a mixture of solder having a metallic composition of Sn-3.5Ag-0.5Bi-6.0In with a particle size of 38 μm to 53 μm and flux of 10 wt %, and the solder paste 17 has a viscosity of about 200 Pa·s.

The substrate electrodes 11 are formed by etching copper foil in a predetermined pattern on the insulating substrate 10 that is a laminate of the copper foil. The substrate electrodes 11 are rectangular and are 35 μm in thickness. The dimensions of the substrate electrode 11 are 0.7 mm along the longitudinal axis and 0.9 mm along the crosswise axis according to the orientation of the electronic component 15 placed on the substrate electrodes 11. As shown in FIG. 1(A), the direction of the longitudinal axis corresponds to the direction of longitudinal axis A-A' and the direction of the crosswise axis corresponds to the direction of crosswise axis B-B'.

The electrode notch 12 is formed by completely removing a part of the substrate electrode 11 by chemical etching in the thickness direction. The dimensions and width of the electrode notch 12 will be described later. The position of the electrode notch 12 will be described below with reference to the layout of the substrate electrodes 11 on which the electronic component 15 is placed.

The width of the electrode notch 12 is defined as the dimension in the crosswise direction of the electrode notch 12 (see "h" in FIG. 1(A)).

An example of a space of the present invention corresponds to the electrode notch 12 of the present embodiment. An example of a width of the space of the present invention corresponds to the width h (μm) of the electrode notch 12 of the present embodiment. An example of the longitudinal direction of an electronic component according to the present invention corresponds to the direction of the longitudinal axis of the present embodiment. Further, an example of the crosswise direction of the electronic component according to the present invention corresponds to the direction of the crosswise axis of the present embodiment.

As shown in FIG. 1(A), the electrode notch 12 is located between an end point 12a and an end point 12b. The end point 12a is located on the longitudinal axis A-A' of the electronic component 15 and at the end of an area 100 (a shaded area in FIG. 1(A)) of the substrate electrode 11, the area 100 being located under the overlapping area of the electronic component electrode 16 of the electronic component 15 placed to be joined and the substrate electrode 11. The overlapping area is an area on which the electronic component electrode 16 and the substrate electrode 11 overlap each other when the mounting structure 18 is viewed from above. The end point 12b is located on a peripheral side of the substrate electrode 11, on the longitudinal axis A-A' outside the electronic component 15 (outside the area 100 of the substrate electrode 11, the area 100 being located under the overlapping area of the electronic component electrode 16 and the substrate electrodes 11). The end point 12b of the electrode notch 12 penetrates the peripheral side of the substrate electrode 11. The electrode notch 12 has a length of 0.3 mm in the direction of the longitudinal axis A-A'. Further, the electrode notch 12 has a depth x of 35 μm, which is equal to the thickness of the substrate electrode 11.

Since the electrode notch 12 penetrates, at the end point 12b, a side of the substrate electrode 11, the electrode notch 12 communicates with a clearance 110 created between the side of the substrate electrode 11 and the resist 13.

In FIG. 1(A), the clearance 110 is formed on an external side of each of the pair of the rectangular substrate electrodes 11 that are laterally arranged. The present invention is not limited to this configuration. The clearance 110 may surround the peripheral side of the substrate electrode 11, also in other drawings.

An example of one end of the space according to the present invention corresponds to the end point 12a of the present embodiment. An example of the other end of the space according to the present invention corresponds to the end point 12b of the present embodiment. An example of an area of the substrate electrode according to the present invention corresponds to the area 100 of the present embodiment.

The solder paste 17 is printed on the substrate electrodes 11 and the electrode notches 12 by using a printer and a metal mask having a thickness of 150 μm.

The electronic component 15 is mounted by a mounter using a chip resistor having the 1608 size.

The electronic component electrodes 16 and the substrate electrodes 11 are electrically connected at the peak temperature of about 235° C. by using a reflow furnace in an atmosphere.

Figure 2:
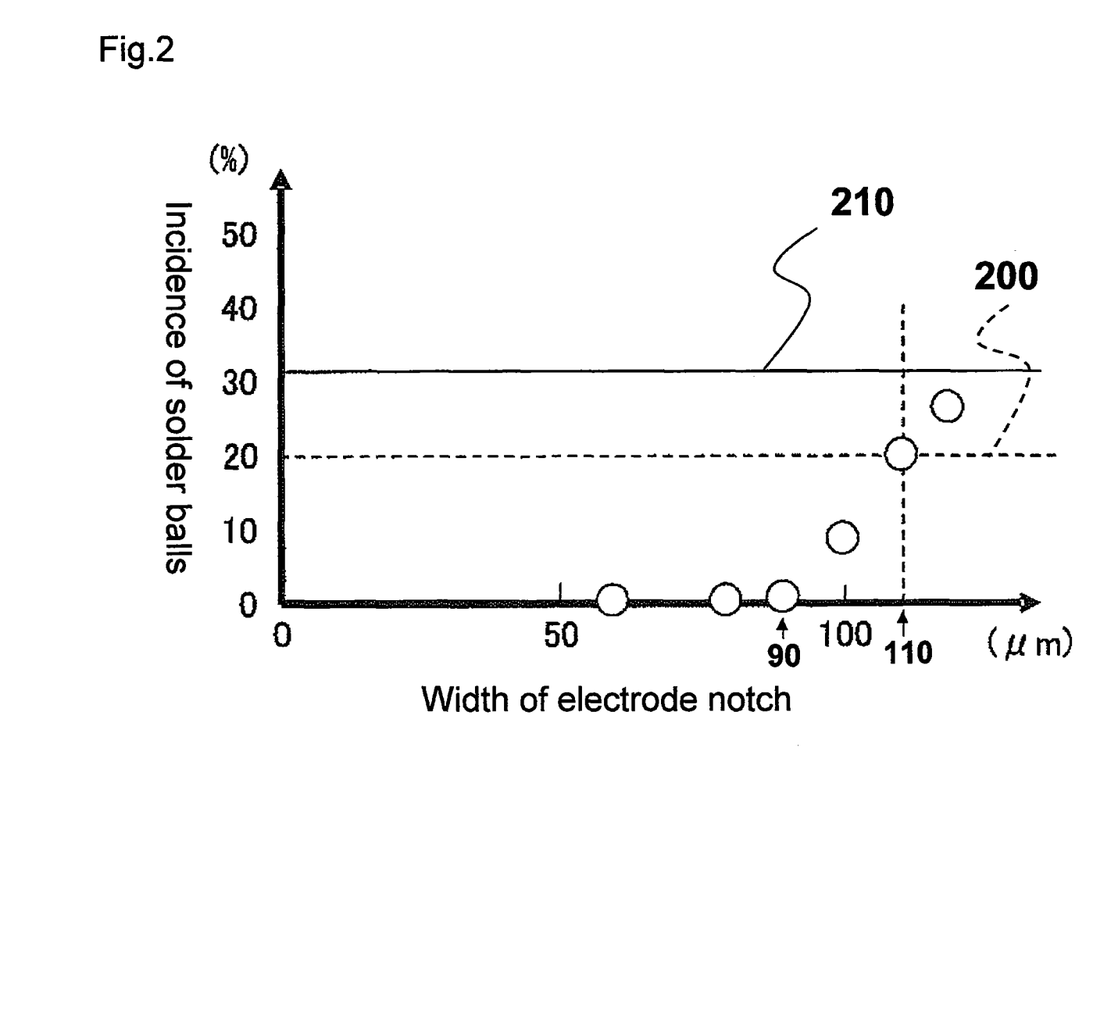
FIG. 2 shows a change of the incidence of solder balls relative to a change of the width of an electrode notch according to the first embodiment.

FIG. 2 shows a change of the incidence (%) of solder balls relative to a change of width h (μm) of the electrode notch 12 according to the first embodiment.

Table 1 shows the width h (μm) of the electrode notch 12 prepared in the first embodiment and the incidence (%) of solder balls.

TABLE 1

| Width of electrode notch (μm) | 60 | 80 | 90 | 100 | 110 | 120 |
|---|---|---|---|---|---|---|
| Incidence of solder balls (%) | 0 | 0 | 0 | 10 | 20 | 25 |

Figure 3:
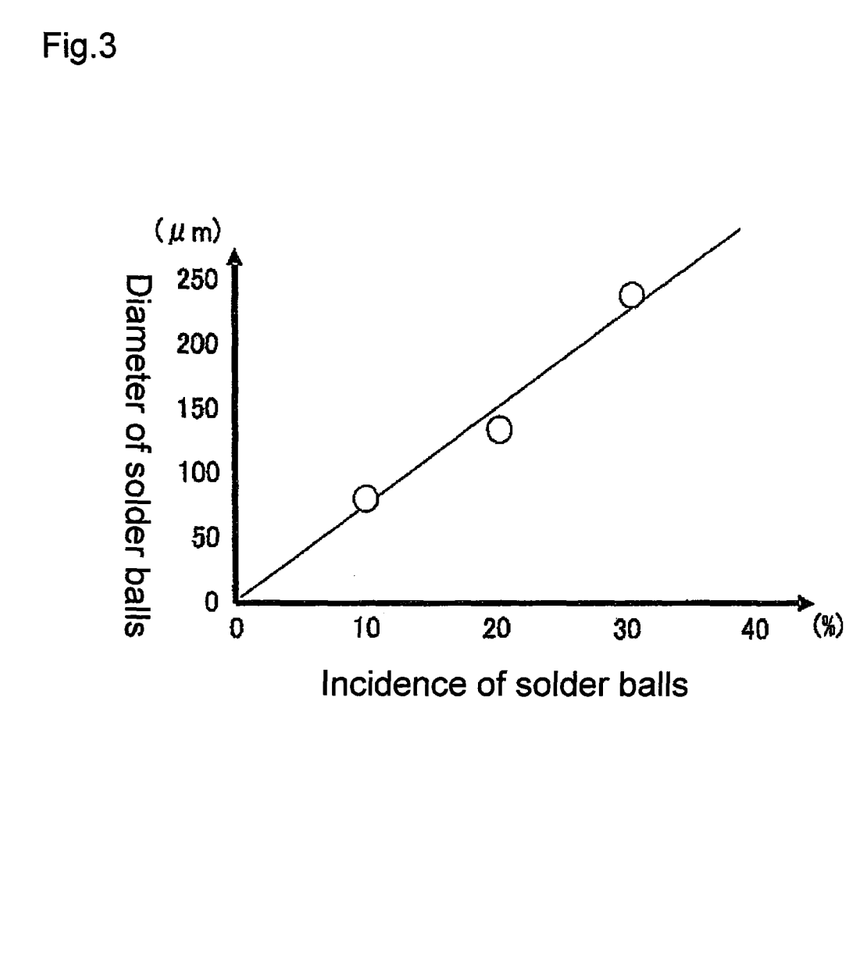
FIG. 3 shows the relationship between the incidence of solder balls and the maximum diameter of generated solder balls according to the first embodiment.

FIG. 3 shows the relationship between the incidence of solder balls and the maximum diameter of generated solder balls according to the first embodiment. Table 2 shows the values of FIG. 3.

TABLE 2

| Incidence of solder balls (%) | 10 | 20 | 30 |
|---|---|---|---|
| Diameter of solder balls (μm) | 75 | 141 | 231 |

As shown in FIG. 3, the higher the incidence of the solder balls is, the larger the diameter of the solder ball generated is. In the related art, the maximum diameter of generated solder balls is about 210 μm. At present, the minimum interval between the terminals of typical ball grid array (BGA) components is about 200 μm, so that solder balls of 200 μm or larger are likely to cause short circuits. For this reason, the upper limit of the incidence of solder balls is set at 20% or less to prevent the occurrence of solder balls of 200 μm or larger, so that the effect of the present invention is obtained.

As shown in FIG. 2, when the electrode notch 12 has a width of 90 μm to 120 μm, the incidence of solder balls decreases with a reduction in the width h of the electrode notch 12. When the electrode notch 12 has a width of 110 μm or less, the effect of the present invention is obtained. When the electrode notch 12 has a width of 90 μm or less, the incidence of solder balls is 0%.

The results of FIG. 2 prove that the width h of the electrode notch 12 has to be set at 110 μm or less, particularly desirably at 90 μm or less to suppress the occurrence of solder balls in the first embodiment (except for 0 μm at which the electrode notch 12 is not provided).

Figure 4:
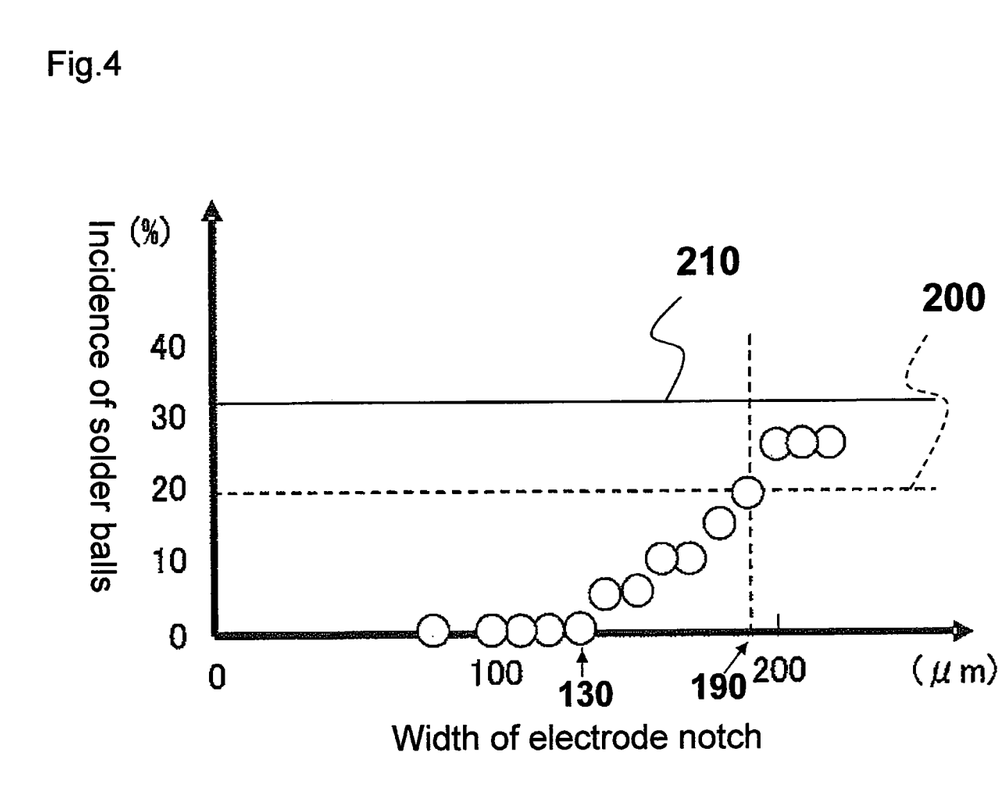
FIG. 4 shows a change of the incidence of solder balls relative to a change of the width of an electrode notch according to a second embodiment of the present invention.
Figure 8:
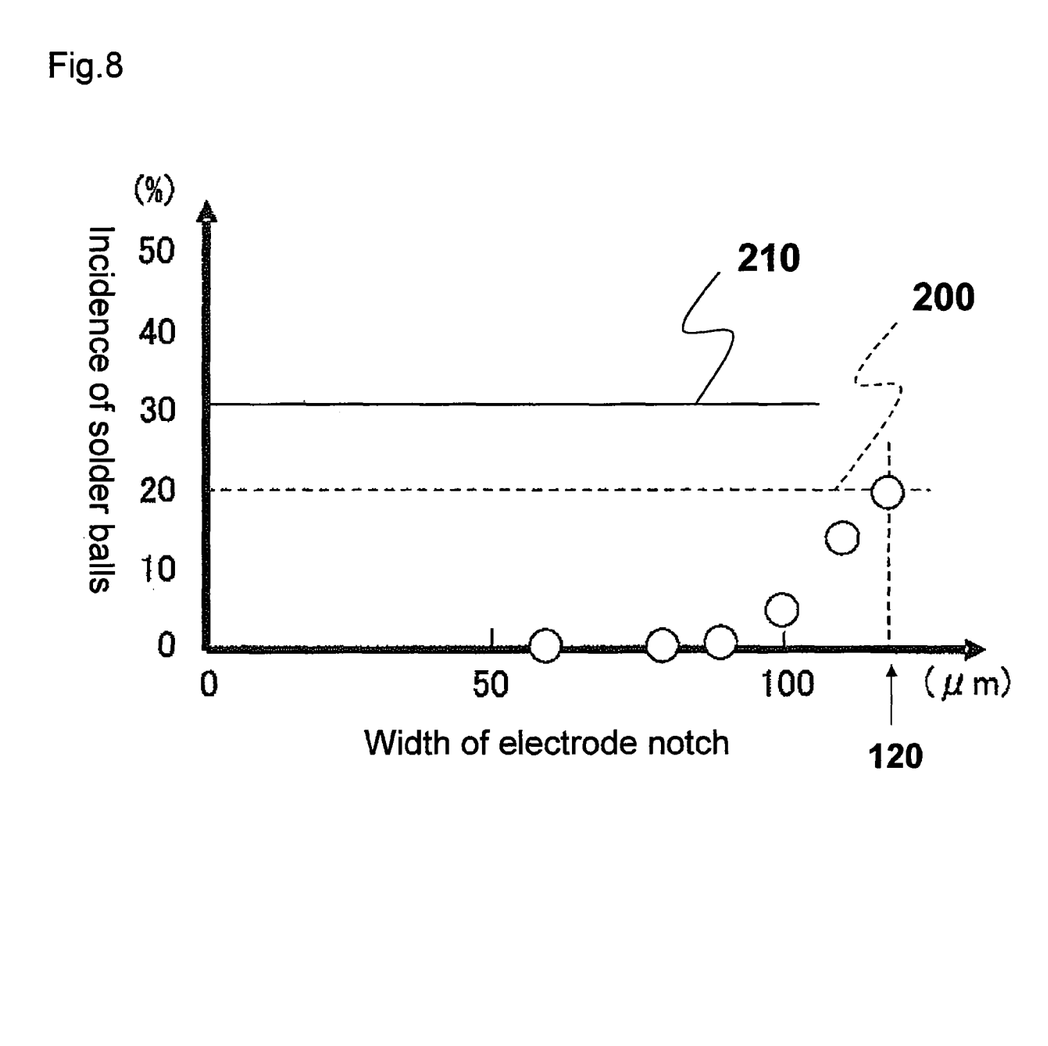
FIG. 8 shows a change of the width of an electrode notch and a change of the incidence of solder balls according to the fourth embodiment.

In FIG. 2, a broken line 200 indicates a solder ball incidence of 20% and a solid line 210 for reference indicates a solder ball incidence (30%) in the case where no electrode notch is formed, also in FIGS. 4 and 8.

With this configuration, in the case where the flux flows due to a dipping phenomenon of flux during heating of SMT, a capillary force is applied to the flux around the electrode notch 12 to sequentially draw the flux into the electrode notch 12, starting from the vicinity of the electrode notch 12. Consequently, the flux flows into the electrode notch 12 and suppresses a flux flow caused by a dipping phenomenon of flux into a space S under the electronic component 15 and a solder flow caused by the flux flow.

The flux flow generated along the electrode notch 12 moves from the end point 12a to the clearance 110.

As described above, the mounting structure 18 of the first embodiment can suppress a solder flow under the electronic component 15, suppressing the occurrence of solder balls.

(Second Embodiment)

In the first embodiment, the thickness of the substrate electrode 11 is set at 35 μm, whereas in a second embodiment of the present invention, a substrate electrode 11 is 105 μm in thickness.

An electrode notch 12 has a depth x of 105 μm, which is equal to the thickness of the substrate electrode 11. As in the first embodiment, as shown in FIG. 1(A), the electrode notch 12 is located between an end point 12a and an end point 12b. The end point 12a is located on the longitudinal axis A-A' of an electronic component 15 and at the end of an area 100 of the substrate electrode 11, the area 100 being located under the overlapping area of an electronic component electrode 16 of the placed electronic component 15 and the substrate electrode 11. The overlapping area is an area on which the electronic component electrode 16 and the substrate electrode 11 overlap each other when a mounting structure 18 is viewed from above. The end point 12b is located on a peripheral side of the substrate electrode 11, on the longitudinal axis A-A' outside the electronic component 15. The end point 12b of the electrode notch 12 penetrates the peripheral side of the substrate electrode 11. The electrode notch 12 has a length of 0.3 mm in the direction of the longitudinal axis A-A'.

FIG. 4 shows a change of the incidence (%) of solder balls relative to a change of a width h (μm) of the electrode notch 12 according to the second embodiment.

Table 3 shows the width h (μm) of the electrode notch 12 prepared in the second embodiment and the incidence (%) of solder balls.

TABLE 3

| Width of electrode notch (μm) | 80 | 100 | 110 | 120 | 130 | 140 | 150 | 160 | 170 | 180 | 190 | 200 | 210 | 220 |
|---|---|---|---|---|---|---|---|---|---|---|---|---|---|---|
| Incidence of solder balls (%) | 0 | 0 | 0 | 0 | 0 | 5 | 5 | 10 | 10 | 15 | 20 | 25 | 25 | 25 |

As in the first embodiment, the reference value of the incidence of solder balls is set at 20% or less to obtain the effect of the present invention.

As shown in FIG. 4, when the width h of the electrode notch 12 is 130 μm to 210 μm, the incidence of solder balls decreases with a reduction in the width h of the electrode notch 12. The effect of the present invention is obtained when the width h is 190 μm or less. The incidence of solder balls is 0% when the width h is 130 μm or less.

The results of FIG. 4 prove that the width h of the electrode notch 12 has to be set at 190 μm or less, particularly desirably at 130 μm or less to suppress the occurrence of solder balls in the second embodiment.

Figure 5:
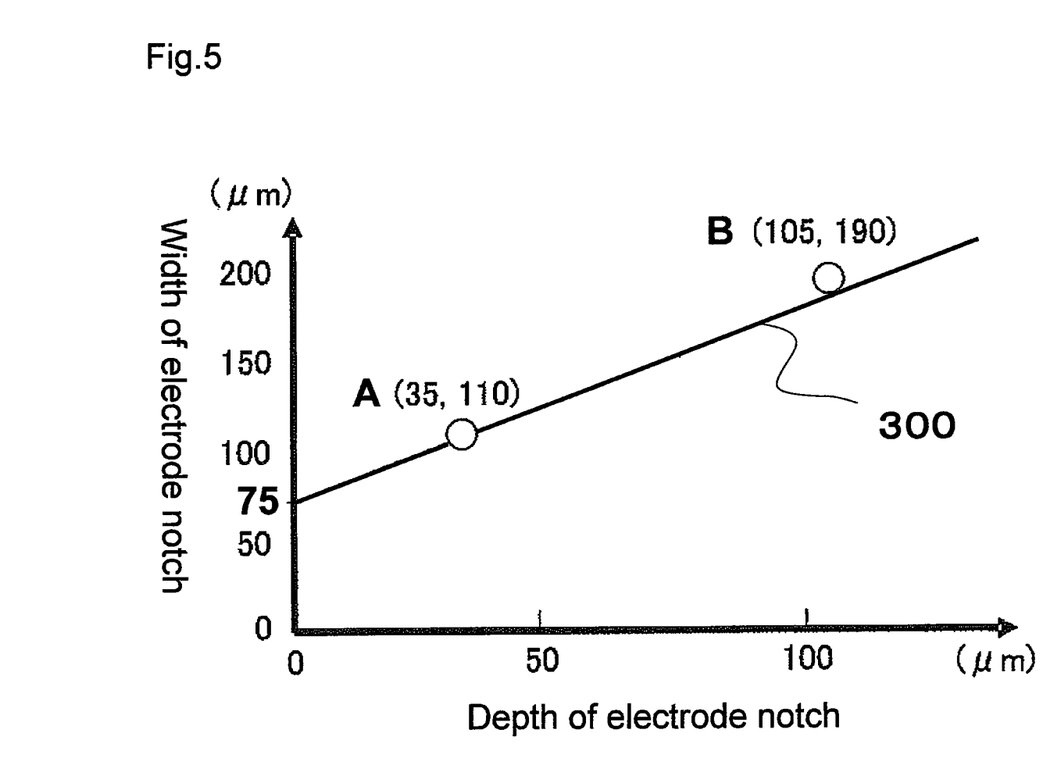
FIG. 5 shows the relationship between the depth of the electrode notch and the maximum width of the electrode notch according to the first and second embodiments.

FIG. 5 shows the relationship between the depth x of the electrode notch 12 in the first and second embodiments and the maximum width h of the electrode notch 12 when the effect of the present invention is obtained.

As shown in FIG. 5, when the depth x of the electrode notch 12 is 35 μm, the maximum width h of the electrode notch 12 is 110 μm (see the point A (35,110) in FIG. 5). When the depth x of the electrode notch 12 is 105 μm, the maximum width h of the electrode notch 12 is 190 μm (see the point B (105,190) in FIG. 5).

As the depth x of the electrode notch 12 increases, the electrode notch 12 increases in cross-sectional area in parallel with the width direction of the electrode notch 12 (in the direction of the crosswise axis B-B' in FIG. 1). Thus it is possible to enhance the effect of a flux flow to the electrode notch 12 due to capillarity and increasing the width h of the electrode notch 12 in design so as to obtain the effect of the present invention.

As shown in FIG. 5, the effect of the present invention is obtained in the case where the number of electrode notches 12 is one, the substrate electrode has a typical thickness of 9 μm to 1000 μm, and the width h (μm) and the depth x (μm) of the electrode notch 12 have the following relation:

$$0 < h(\mu m) \leq x(\mu m) + 75(\mu m) \quad (1)$$

In other words, a straight line 300 in FIG. 5 passes through point A (35,110) and point B (105,190) and has an intercept at 75 (μm) on the vertical axis (representing the width h of the electrode notch). Further, the straight line 300 has the following relation:

$$h(\mu m) = x(\mu m) + 75(\mu m) \quad (2)$$

Thus the effect of the present invention is obtained in the case where the electrode notch 12 has a width h (μm) and a depth (μm) in an area located under the straight line 300 satisfying equation (2) with respect to the vertical axis.

(Third Embodiment)

In a third embodiment of the present invention, an end point 12a of an electrode notch 12 is relocated, which is illustrated in FIG. 1.

An end point 12b of the electrode notch 12 is located as in the first and second embodiments.

Since the position of the end point 12a of the electrode notch 12 determines the length of the electrode notch 12, the position of the end point 12a of the electrode notch 12 is expressed by the length of the electrode notch 12 in the following explanation.

The electrode notch 12 of the third embodiment has a depth x of 35 μm, which is equal to the thickness of a substrate electrode 11, and a width h of 80 μm.

Figure 6:
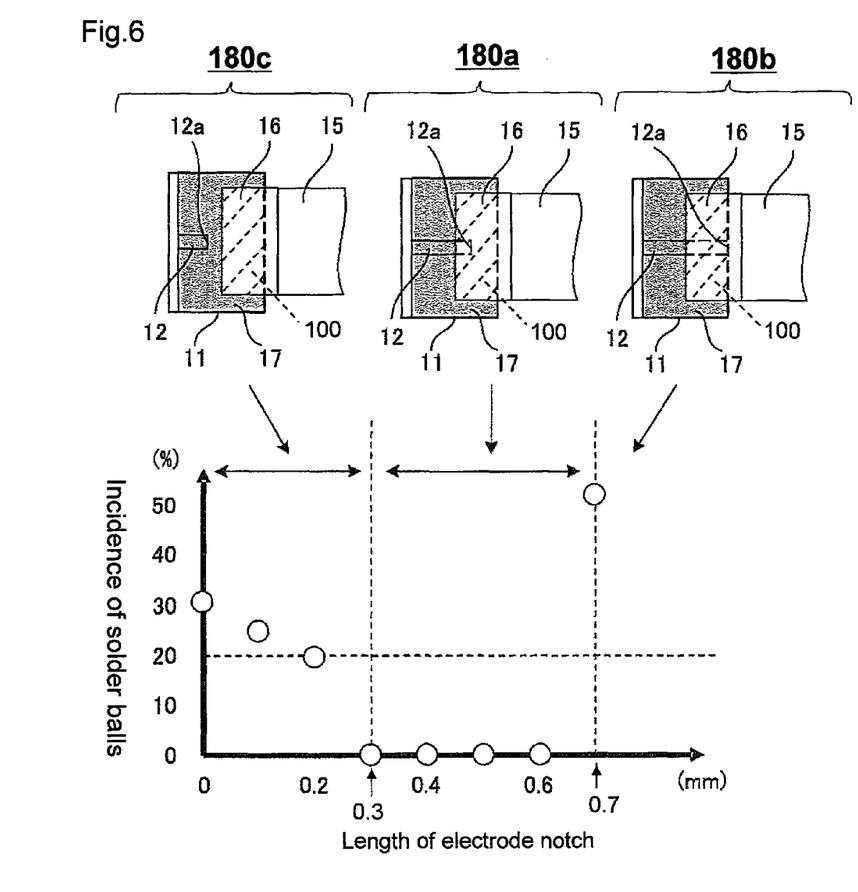
FIG. 6 shows a change of the length of an electrode notch and a change of the incidence of solder balls according to a third embodiment of the present invention.

FIG. 6 shows a length of the electrode notch 12 and a change of the incidence of solder balls according to the third embodiment.

In the case where the electrode notch 12 has a length of 0.3 mm in the direction of longitudinal axis A-A' (see the mounting structure 18 of FIG. 1), the end point 12a of the electrode notch 12 is located under the end of an electronic component electrode 16. As shown in a mounting structure 180b of FIG. 6, in the case where the electrode notch 12 has a length of 0.7 mm, the end point 12a of the electrode notch 12 penetrates a peripheral side of the substrate electrode 11.

In a mounting structure 180a of FIG. 6, the length of the electrode notch 12 is larger than 0.3 mm and is smaller than 0.7 mm. In a mounting structure 180c of FIG. 6, the electrode notch 12 has a length between 0 mm to 0.2 mm.

Table 4 shows a length of the electrode notch 12 prepared in the third embodiment and the incidence of solder balls.

TABLE 4

| Length of electrode notch (mm) | 0 | 0.1 | 0.2 | 0.3 | 0.4 | 0.5 | 0.6 | 0.7 |
|---|---|---|---|---|---|---|---|---|
| Incidence of solder balls (%) | 30 | 25 | 20 | 0 | 0 | 0 | 0 | 50 |

As in the first and second embodiments, the reference value of the incidence of solder balls is set at 20% or less to obtain the effect of the present invention.

As shown in FIG. 6, when the electrode notch 12 has a length of 0 mm to 0.2 mm (see the mounting structure 180c of FIG. 6), the incidence of solder balls is higher than 20%. When the electrode notch 12 has a length of 0.3 mm to 0.6 mm (see the mounting structure 18 of FIG. 1, the mounting structure 180a of FIG. 6), the incidence of solder balls is 0%. When the electrode notch 12 has a length of 0.7 mm (see the mounting structure 180b of FIG. 6), the incidence of solder balls increases to 50%.

According to the results of FIG. 6, in the case where the end point 12a of the electrode notch is located at the end of an area 100 of the substrate electrode 11 (except for the mounting structure 180b of FIG. 6 in which the electrode notch has a length of 0.7 mm) or inside the area 100 located under the overlapping area of the electronic component electrode 16 and the substrate electrode 11, the incidence of solder balls is 0%.

However, in the case where the electrode notch 12 has a short length and the end point 12a of the electrode notch 12 is not located under the electronic component electrode 16 (see the mounting structure 180c of FIG. 6), only a small capillary force is applied to a flux flow under the electronic component electrode 16, resulting in insufficient suppression of the occurrence of solder balls.

Further, in the case where the electrode notch 12 reaches a space S between the electronic component 15 and an insulating substrate 10, at the end of the area 100 of the substrate electrode 11 (when the electrode notch has a length of 0.7 mm in the graph of FIG. 6), a capillary force is generated to the space S under the electronic component 15, resulting in insufficient suppression of the occurrence of solder balls.

Thus in order to obtain the effect of the present invention, it is necessary to have the relation between the width h and the depth x of the electrode notch 12 in the first and second embodiments and locate the end point 12a of the electrode notch 12 at the end of the area 100 of the substrate electrode 11 (except for the mounting structure 180b of FIG. 6 in which the electrode notch has a length of 0.7 mm) or inside the area 100 located under the overlapping area of the electronic component electrode 16 and the substrate electrode 11.

(Fourth Embodiment)

Figure 7:
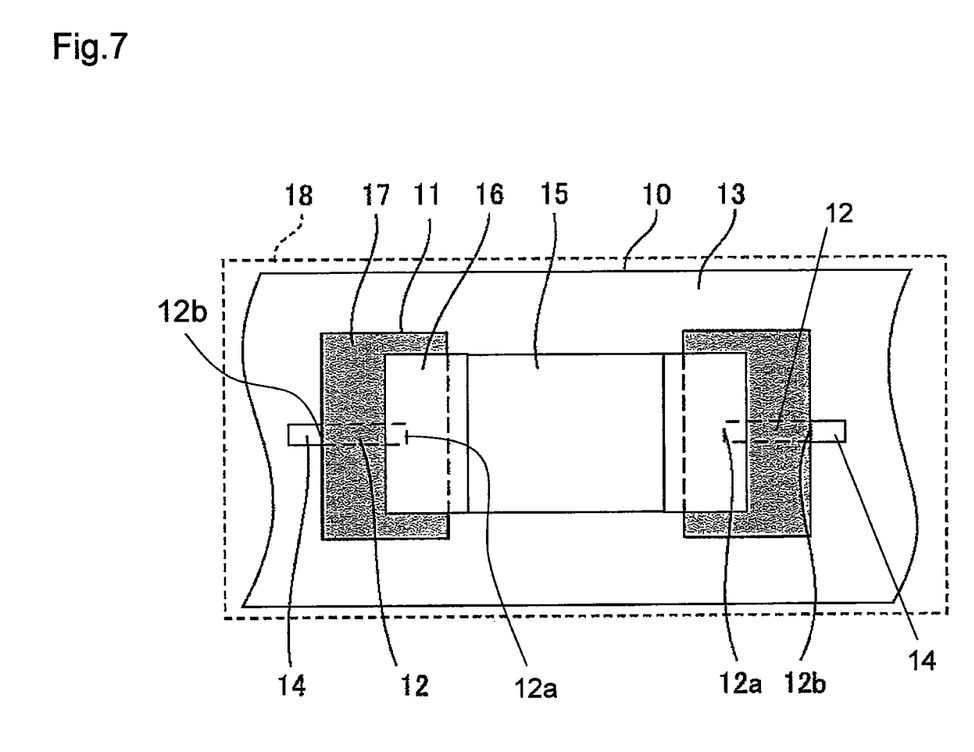
FIG. 7 is an enlarged top view showing the principle part of a mounting structure according to a fourth embodiment of the present invention.

FIG. 7 is a top view of an enlarged schematic view showing the principle part of a mounting structure according to a fourth embodiment of the present invention. In FIG. 7, the same constituent elements as in FIG. 1 are indicated by the same reference numerals and the explanation thereof is omitted.

In FIG. 7, a mounting structure 18 includes resist notches 14 on a resist 13, in addition to electrode notches 12. The resist notch 14 is located between an end point 12b of the electrode notch 12 and a point on the extension of the electrode notch 12. The resist notch 14 is formed by patterning a mask for the application of the resist 13 according to the resist notch 14.

FIG. 8 shows a change of the width of the electrode notch and a change of the incidence of solder balls according to the fourth embodiment. Table 5 shows a width of the electrode notch 12 prepared in the fourth embodiment and an incidence of solder balls.

TABLE 5

| Width of electrode notch (μm) | 60 | 80 | 90 | 100 | 110 | 120 |
|---|---|---|---|---|---|---|
| Incidence of solder balls (%) | 0 | 0 | 0 | 5 | 15 | 20 |

As in the first to third embodiments, the reference value of the incidence of solder balls is set at 20% or less to obtain the effect of the present invention.

As shown in FIG. 8, when the electrode notch 12 has a width h of 90 μm to 120 μm, the incidence of solder balls decreases with a reduction in the width h of the electrode notch 12. When the width h is 120 μm or less, the effect of the present invention is obtained. When the width h is 90 μm or less, the incidence of solder balls is 0%.

A comparison between FIGS. 2 and 8 proves that the incidence of solder balls is lower in the fourth embodiment than in the first embodiment. Thus this configuration including the resist notches 14 in addition to the electrode notches 12 forms a longer notched part than in the first embodiment, which obtains a larger capillary force, thereby enhancing the effect of suppressing the occurrence of solder balls. In other words, the occurrence of solder balls is suppressed because flux is drawn also into the resist notch 14 and increases an outward force.

As in FIG. 1, even if a clearance 110 is formed between the substrate electrode 11 and the resist 13 in the mounting structure 18 of FIG. 7, the flux drawn into the resist notch 14 effectively acts on capillarity.

Further, it can be said that in the mounting structure 18 not including the clearance 110 (see FIG. 1(A)) as shown in FIG. 7, a capillary force can be more effectively used by the resist notch 14 as compared with the absence of the resist notch 14.

In the foregoing embodiments, the single electrode notch 12 is provided. The number of electrode notches 12 is not limited to one in the present invention. For example, multiple electrode notches shown in FIGS. 9(A) and 9(B) can obtain the effect of the present invention.

In this case, it is desirable that the electrode notches 12 each have a width h and a depth x so as to satisfy equation (1).

In the case where the electrode notch 12 does not satisfy equation (1), for example, in the case where the width h is too large relative to the depth x, a capillary force decreases. However, even if it is such electrode notch by providing multiple electrode notches, capillary forces may be integrated and achieve the same effect as the present invention.

Figure 9A:
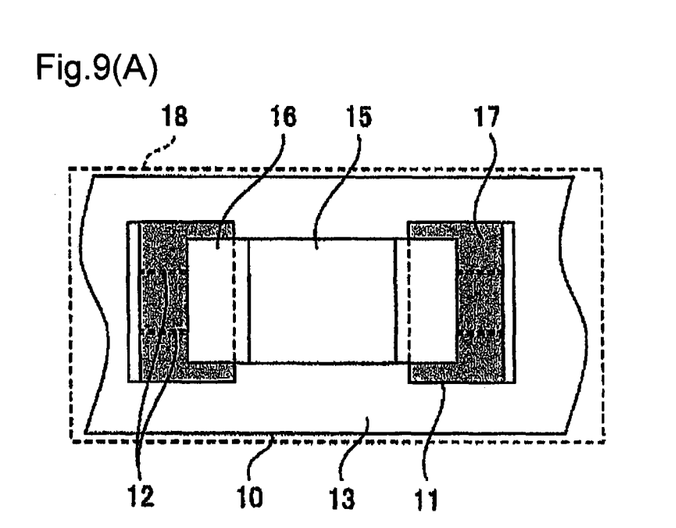
FIGS. 9(A) and 9(B) show examples of the mounting structure in which a plurality of the electrode notches of the embodiment of the present invention are provided.
Figure 9B:
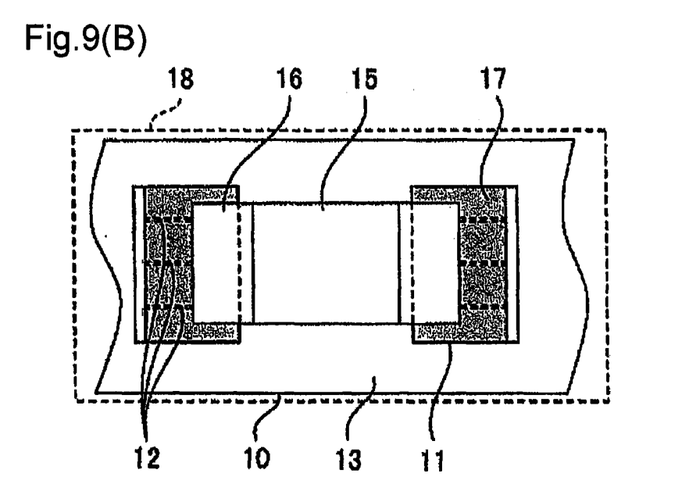

Also in the structures of FIGS. 9(A) and 9(B), the resist notches 14 may be provided, which are not shown, on the extensions of the electrode notches 12 as in the fourth embodiment.

In the foregoing embodiments, the substrate electrode 11 is made of copper and the dimensions of the substrate electrode 11 are 0.7 mm along the longitudinal axis and 0.9 mm along the crosswise axis according to the orientation of the placed electronic component 15. A capillary force is generated regardless of the material and shape of the substrate electrode 11 and thus the present invention is not limited to this configuration. For example, the surface of the substrate electrode may be plated or the substrate electrode 11 may have different dimensions.

In the foregoing embodiments, the electrode notches 12 are provided in parallel with the longitudinal axis A-A'. The present invention is not limited to this configuration. It is only necessary to suppress a flux flow to the space S under the electronic component 15 and thus, for example, as shown in FIGS. 10(A) to 10(D), the electrode notches 12 may be provided in parallel with the crosswise axis B-B' (FIG. 1) or radially provided.

Figure 10A:
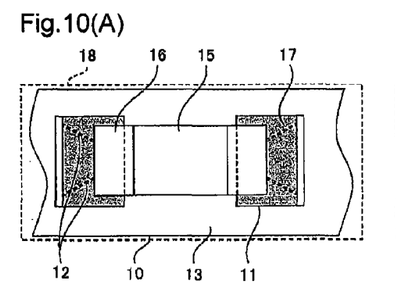
FIGS. 10(A) to 10(D) and 10(G) show other examples of the mounting structure in which a plurality of the electrode notches of the present embodiment are provided.
Figure 10B:
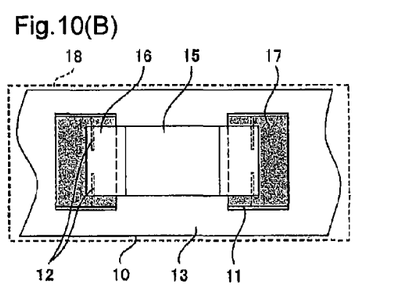
Figure 10C:
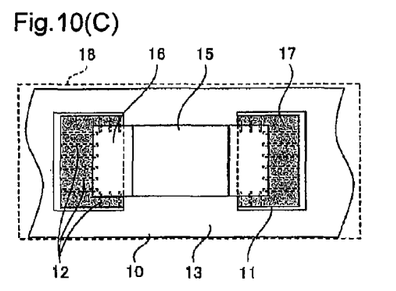
Figure 10D:
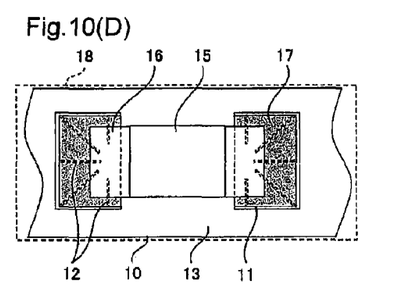
Figure 10E:
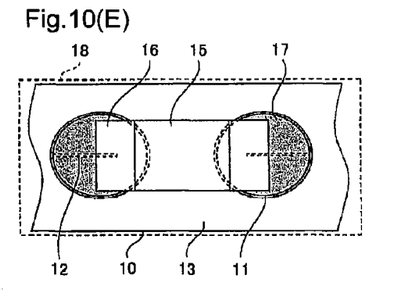
FIGS. 10(E) and 10(F) show other examples of the substrate electrodes of the mounting structure.
Figure 10F:
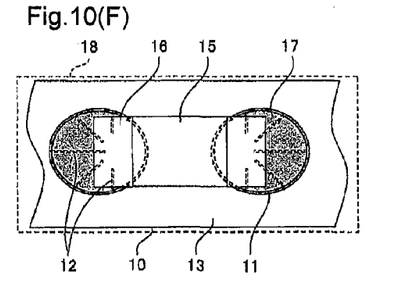

In the foregoing embodiments, the substrate electrodes 11 are rectangular. The present invention is not limited to this configuration. For example, as shown in FIGS. 10(E) and 10(F), the substrate electrodes 11 may have other shapes such as circles.

Figure 10G:
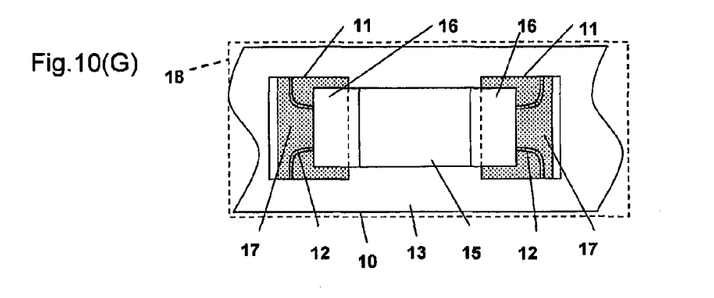

In the foregoing embodiments, the electrode notches 12 are shaped like straight lines. The present invention is not limited to this configuration. For example, as shown in FIG. 10(G), the electrode notches 12 may be curved.

Figure 11A:
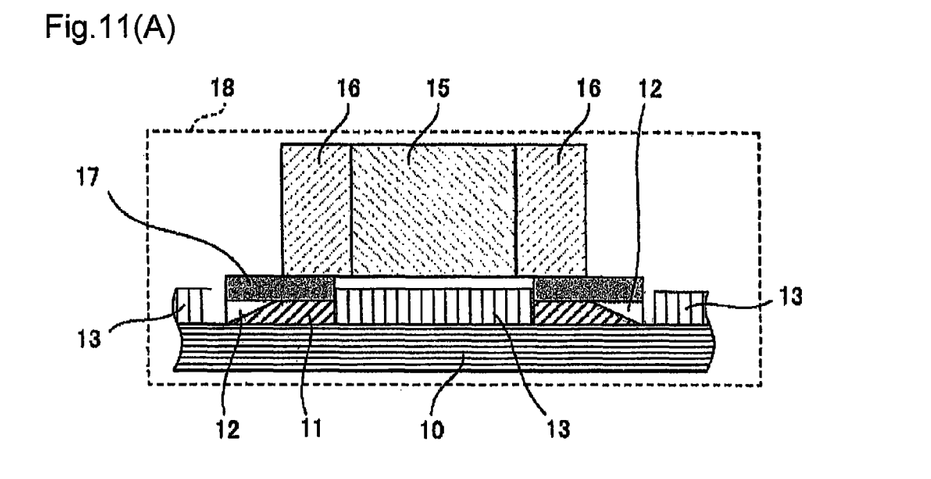
FIGS. 11(A) and 11(B) are sectional views showing other configurations of the electrode notches in the mounting structure of the present embodiment.
Figure 11B:
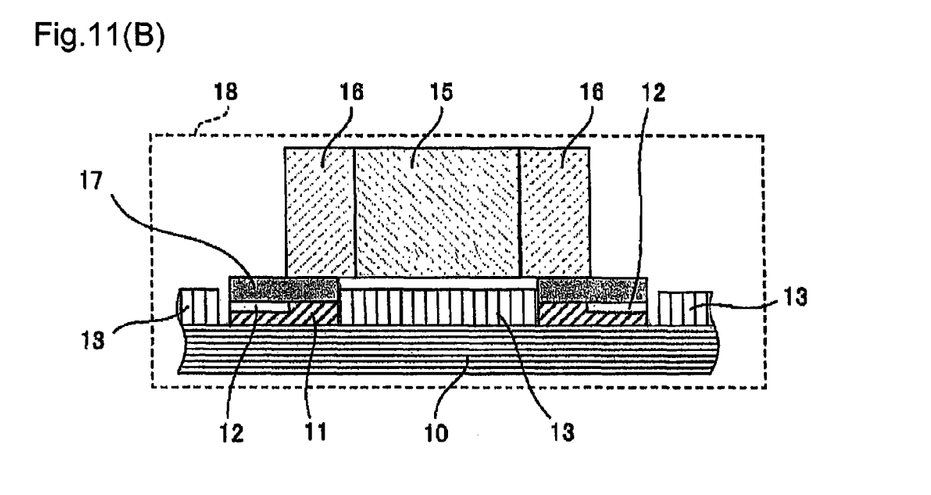

In the foregoing embodiments, copper foil is completely removed to form the electrode notches 12. Since the effect of the present invention can be obtained by capillarity, for example, the electrode notches 12 may be inclined as shown in FIG. 11(A) or may be half etched as shown in FIG. 11(B).

In the foregoing embodiments, the electrode notches 12 and the resist notches 14 are formed by chemical etching. The forming method is not particularly limited and thus the electrode notches 12 and the resist notches 14 may be formed by, e.g., laser etching.

In the foregoing embodiments, the solder paste 17 has a metallic composition of Sn-3.5Ag-0.5Bi-6.0In. The present invention is not limited to this metallic composition. For example, metallic compositions of, e.g., Sn—Ag and Sn—Bi which are likely to cause solder balls (metals susceptible to oxidation) may be used.

In the foregoing embodiments, the solder paste has a particle size of 38 μm to 53 μm and a viscosity of about 200 Pa·s. The particle size and the viscosity of solder are not particularly limited. For example, fine particles of 10 μm or less may be used or solder paste 17 for dispensers may be used with a viscosity of 100 Pa·s or less.

In the foregoing embodiments, the end point 12a of the electrode notch 12 was located with respect to the area 100 that is on the substrate electrode 11 and located under the overlapping area of the electronic component electrode 16 and the substrate electrode 11. The present invention is not limited to this configuration. In short, the end point 12a may be located with respect to an area that is on in the substrate electrode 11 and located under the contact area of the electronic component 15 and the solder paste 17. In other words, in this case, the electrode notch 12 is formed from the end of the area of the substrate electrode 11 or the inside of the area to a peripheral side of the substrate electrode 11, and the electrode notch 12 does not reach the peripheral side, which is located under the electronic component 15, of the substrate electrode 11. With this configuration, for example, even in the case where the electronic component 15 with the electronic component electrodes varied in shape and size is mounted on the pair of substrate electrodes, it is only necessary to consider the contact area of the electronic component 15 and the solder paste 17 (corresponding to the area 100 of FIG. 1(A)). Thus the position of the end point 12a of the electrode notch can be determined regardless of the shape and size of the electronic component electrode. For example, in FIGS. 1(A) and 1(B), the inner side 16a of the electronic component electrode 16 protrudes to the space S between the electronic component 15 and the resist 13, more than the inner side 11a of the substrate electrode 11 entirely coated with the solder paste 17. Also in the case where the side 16a is entirely or partially provided above the side 11a of the substrate electrode 11, the technical idea is effective in which the position of the end point 12a may be located with respect to the area that is on the substrate electrode 11 and located under the contact area of the electronic component 15 and the solder paste 17.

The mounting structure of the present invention can suppress a flux flow caused by a dipping phenomenon of flux under an electronic component during heating in SMT steps and suppress a solder flow under the electronic component, thereby suppressing the occurrence of solder balls. The present invention is useful for, e.g., a mounting structure fabricated by SMT.

What is claimed is:

1. A mounting structure comprising:
   an insulating substrate having a substrate electrode on which at least one space is provided and a resist surrounding the substrate electrode;
   an electronic component having an electronic component electrode to be electrically connected to the substrate electrode; and
   solder paste printed on a surface of the substrate electrode, the solder paste being used for soldering the substrate electrode and the electronic component electrode;
   wherein the space has a following relation $0 < h(\mu m) \leq x(\mu m) + 75(\mu m)$ where h (μm): width of the space
   x (μm): depth of the space,
   the width of the space is defined as a dimension in a crosswise direction of the space,
   the space is formed from an end of an area of the substrate electrode, the area being located under the electronic component electrode, or from inside of the area of the substrate electrode to a peripheral side of the substrate electrode, and
   the space does not reach a peripheral side of the substrate electrode, the peripheral side being located under the electronic component.

2. The mounting structure according to claim 1, wherein the space has one end closed at the end of the area of the substrate electrode or inside the area of the substrate electrode and the space has another end opened on the peripheral side of the substrate electrode, the other end being not located under the electronic component.

3. The mounting structure according to claim 2, wherein the electronic component has an external shape like a rectangular solid,
   the electronic component has a pair of electronic component electrodes disposed on respective ends of the electronic component in a longitudinal direction of the electronic component,
   the insulating substrate has a corresponding pair of substrate electrodes, on each of which the at least one space is provided, and
   the other end of the space is provided on the peripheral side of each of the pair of substrate electrodes such that the other ends are located in opposite positions from each other.

4. The mounting structure according to claim 3, wherein the space is formed from each of the insides of the areas of the pair of the substrate electrodes to each of the opposite positions of the peripheral sides along the longitudinal direction of the electronic component, the space being located at a center of the electronic component in a crosswise direction of the electronic component.

5. The mounting structure according to claim 1, wherein a plurality of the spaces are formed on the substrate electrode.

6. The mounting structure according to claim 1, wherein the depth of the space is equivalent to a thickness of the substrate electrode.

7. The mounting structure according to claim 1, wherein the resist has a second space opposed to the space.

* * * * *